United States Patent
Lin et al.

(10) Patent No.: US 11,411,537 B2
(45) Date of Patent: Aug. 9, 2022

(54) D-CLASS AMPLIFIER CIRCUIT AND AUDIO AMPLIFYING METHOD

(71) Applicant: REALTEK SEMICONDUCTOR CORP., Hsinchu (TW)

(72) Inventors: Che-Hung Lin, Hsinchu (TW);
You-Min Lai, Hsinchu (TW);
Kok-Choon Cheng, Hsinchu (TW);
Li-Lung Kao, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 2 days.

(21) Appl. No.: 16/950,305

(22) Filed: Nov. 17, 2020

(65) Prior Publication Data
US 2021/0152128 A1    May 20, 2021

(30) Foreign Application Priority Data
Nov. 18, 2019   (TW) .................. 108141841

(51) Int. Cl.
*H03F 3/217* (2006.01)
*H03F 1/02* (2006.01)
*H03F 3/45* (2006.01)

(52) U.S. Cl.
CPC ....... *H03F 1/0205* (2013.01); *H03F 3/45475* (2013.01); *H03F 2200/03* (2013.01); *H03F 2200/129* (2013.01); *H03F 2203/45116* (2013.01)

(58) Field of Classification Search
CPC ....................................... H03F 3/217
USPC ............................. 330/10, 207 A, 251
See application file for complete search history.

(56) References Cited

U.S. PATENT DOCUMENTS

| | | | | |
|---|---|---|---|---|
| 6,448,851 B1 * | 9/2002 | McIntosh | .............. | H03F 1/301 327/307 |
| 8,736,362 B2 * | 5/2014 | Huang | ................ | H03F 3/68 330/10 |
| 8,866,544 B2 * | 10/2014 | Llewellyn | ............ | H03F 3/217 330/10 |
| 9,525,390 B2 * | 12/2016 | Ibusuki | ............. | H03F 3/185 |

* cited by examiner

*Primary Examiner* — Henry Choe
(74) *Attorney, Agent, or Firm* — Birch, Stewart, Kolasch & Birch, LLP

(57) ABSTRACT

A circuit includes an input impedance, an operational amplifier, a voltage-adjusting circuit, a pulse-generating circuit, and a drive circuit. The input impedance is coupled to an input terminal of the operational amplifier, receives an input voltage, and outputs an input current. The operational amplifier is coupled to a first power voltage and outputs an amplified signal according to an input operating voltage and a feedback signal. The voltage-adjusting circuit adjusts the input operating voltage of the operational amplifier. The pulse-generating circuit generates a pulse width modulation signal according to the amplified signal. The drive circuit is coupled to a second power voltage and generates a driving signal according to the pulse width modulation signal. The feedback signal is correlated with the driving signal.

6 Claims, 2 Drawing Sheets

US 11,411,537 B2

D-CLASS AMPLIFIER CIRCUIT AND AUDIO AMPLIFYING METHOD

CROSS-REFERENCE TO RELATED APPLICATION

This non-provisional application claims priority under 35 U.S.C. § 119(a) to Patent Application No. 108141841 filed in Taiwan, R.O.C. on Nov. 18, 2019, the entire contents of which are hereby incorporated by reference.

BACKGROUND

Technical Field

The disclosure relates to an amplifier, and in particular, to a D-class amplifier circuit and an audio amplifying method.

Related Art

A D-class amplifier can convert an audio signal into a high-frequency pulse that can be switched to be output according to the audio input signal. Generally, the D-class amplifier generates a pulse width modulation signal by using a pulse width modulator. Herein, a pulse width of the pulse width modulation signal can change with the amplitude of the audio signal. Compared with an AB-class amplifier, the D-class amplifier has high efficiency. Therefore, the cost, size, and weight of the entire system can be significantly reduced. Moreover, the D-class amplifier can be widely applied to various devices having an audio requirement, such as a mobile phone, a flat-screen TV, and a home theater receiver. However, in the conventional D-class amplifier, a supply voltage of an output stage always affects an operating voltage of the amplifier. Consequently, the amplifier cannot achieve better operating characteristics.

SUMMARY

In an embodiment, a circuit includes an input impedance, an operational amplifier, a voltage-adjusting circuit, a pulse-generating circuit, and a drive circuit. The input impedance is coupled to an input terminal of the operational amplifier, and is configured to receive an input voltage, and to output an input current. The operational amplifier is coupled to a first power voltage, and is configured to output an amplified signal according to an input operating voltage and a feedback signal. The voltage-adjusting circuit is configured to adjust the input operating voltage of the operational amplifier. The pulse-generating circuit is configured to generate a pulse width modulation signal according to the amplified signal. The drive circuit is coupled to a second power voltage, and is configured to generate a driving signal according to the pulse width modulation signal. The feedback signal is correlated with the driving signal.

In a method includes: converting an input current into an input voltage powered by a first power voltage; outputting an amplified signal according to the input voltage, an input operating voltage, and a feedback signal; adjusting the input operating voltage of an operational amplifier; outputting a pulse width modulation signal according to the amplified signal; and generating a driving signal according to the pulse width modulation signal. The driving signal is correlated with the feedback signal.

In some embodiments, adjusting the input operating voltage is implemented by supplying an adjusting current.

In some embodiments, the adjusting current is uncorrelated with the first power voltage.

In some embodiments, the adjusting current is correlated with the first power voltage or correlated with a reference voltage, such as a bandgap voltage.

In some embodiments, a maximum current value of the second power voltage is greater than or equal to a ten times a maximum current value of the first power voltage.

To sum up, according to the D-class amplifier circuit and the audio amplifying method in the disclosure, the input operating voltage of the operational amplifier is not affected by a supply voltage (the second power voltage) at an output stage, and the input operating voltage is not required to be fixed to be a half of a supply voltage (the first power voltage) of the operational amplifier, so that the input operating voltage can be determined according to various input pair forms of the operational amplifier, thereby reaching an optimal operating voltage range of the operational amplifier.

DETAILED DESCRIPTION

Figure 1:
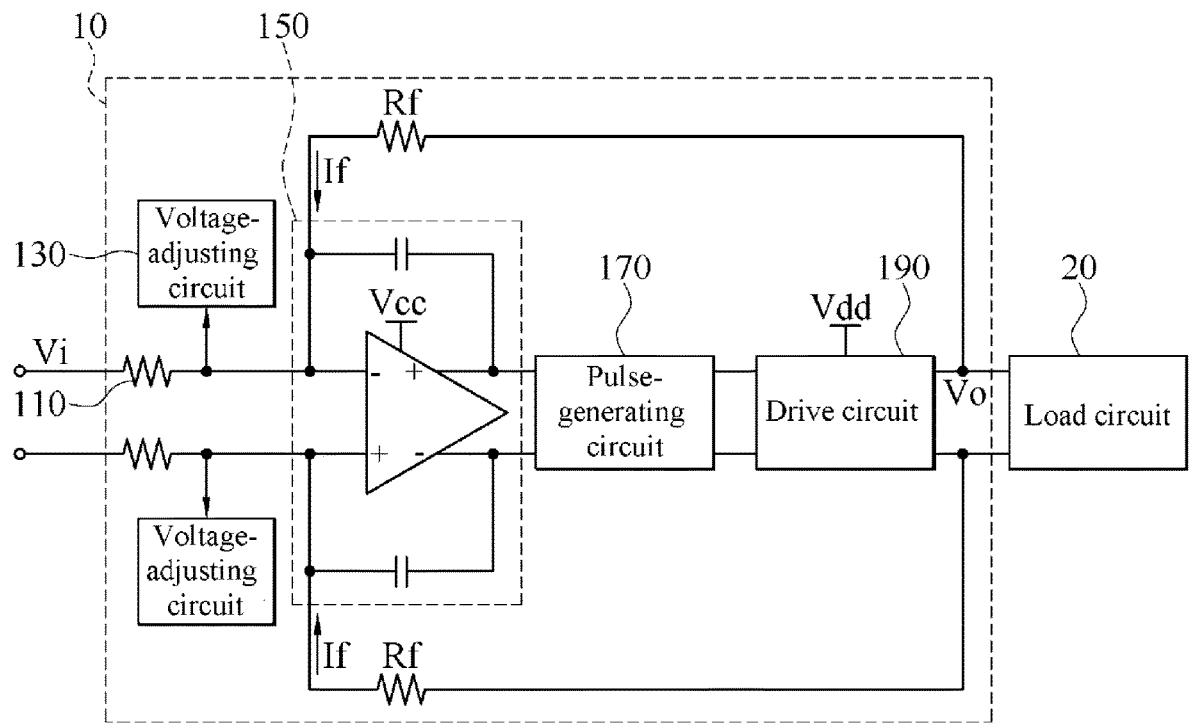
FIG. 1 is a schematic diagram of a D-class amplifier circuit according to an embodiment of the disclosure.

FIG. 1 is a schematic diagram of a D-class amplifier circuit according to an embodiment of the disclosure. The D-class amplifier circuit 10 is configured to receive an input voltage Vi, and output a driving signal Vo according to the input voltage Vi to drive a load circuit 20. In some embodiments, the load circuit 20 may be, for example, an audio output device such as a headset or a loudspeaker, but is not limited thereto.

Herein, the D-class amplifier circuit 10 includes an input impedance 110, a voltage-adjusting circuit 130, an operational amplifier 150, a pulse-generating circuit 170, and a drive circuit 190.

The input impedance 110 and the voltage-adjusting circuit 130 are coupled to an input terminal of the operational amplifier 150. An output terminal of the operational amplifier 150 is coupled to the pulse-generating circuit 170. The pulse-generating circuit 170 is coupled to the operational amplifier 150 and the drive circuit 190. An output of the drive circuit 190 is coupled back to the input terminal of the operational amplifier 150 through a feedback path, and provides a feedback signal If to the operational amplifier 150.

Figure 2:
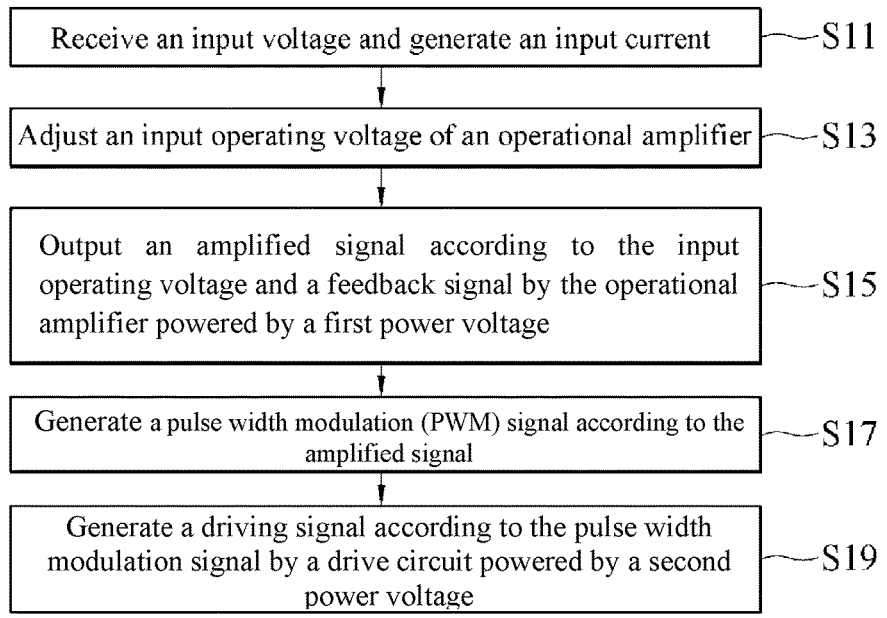
FIG. 2 is a flowchart of an audio amplifying method according to an embodiment of the disclosure.

Referring to FIG. 1 and FIG. 2, the input impedance 110 receives an input voltage Vi and generates an input current, that is, converts the input voltage Vi into the input current (step S11). The voltage-adjusting circuit 130 adjusts an input operating voltage of the operational amplifier 150 (step S13). The operational amplifier 150 is powered by a first power voltage Vcc and outputs an amplified signal according to the input operating voltage and a feedback signal If (step S15). The pulse-generating circuit 170 generates a pulse width modulation signal (PWM Signal) according to the amplified signal (step S17). The drive circuit 190 is powered by a second power voltage Vdd and generates a driving signal Vo according to the pulse width modulation signal (step S19). The feedback signal If is correlated with the driving signal Vo.

In some embodiments, when the D-class amplifier circuit 10 outputs a maximum volume, a maximum current value of the second power voltage Vdd is greater than ten times a maximum current value of the first power voltage Vcc. Generally, relative to the first power voltage Vcc, when responding to a large output current (for example, playing an audio signal with a high volume), the second power voltage Vdd can pump the large current. Relative to the second power voltage Vdd, the signal of the first power voltage Vcc is clean.

In some embodiments, the voltage-adjusting circuit 130 may be designed in such a way that the input operating voltage (hereafter referred to as Vz) of the operational amplifier 150 is unnecessarily fixed to be a half of the first power voltage Vcc (that is, $$Vz \neq \frac{Vcc}{2}),$$

and instead the appropriate input operating voltage is determined according to different input pair transistor forms of the operational amplifier 150 (for example:

$$Vz > \frac{Vcc}{2} \text{ or } Vz < \frac{Vcc}{2}).$$

In some embodiments, the voltage-adjusting circuit 130 adjusts the input operating voltage of the operational amplifier 150 by adjusting an adjusting current (hereafter referred to as It). In an embodiment, the adjusting current (It) may be uncorrelated with the first power voltage Vcc.

Figure 3:
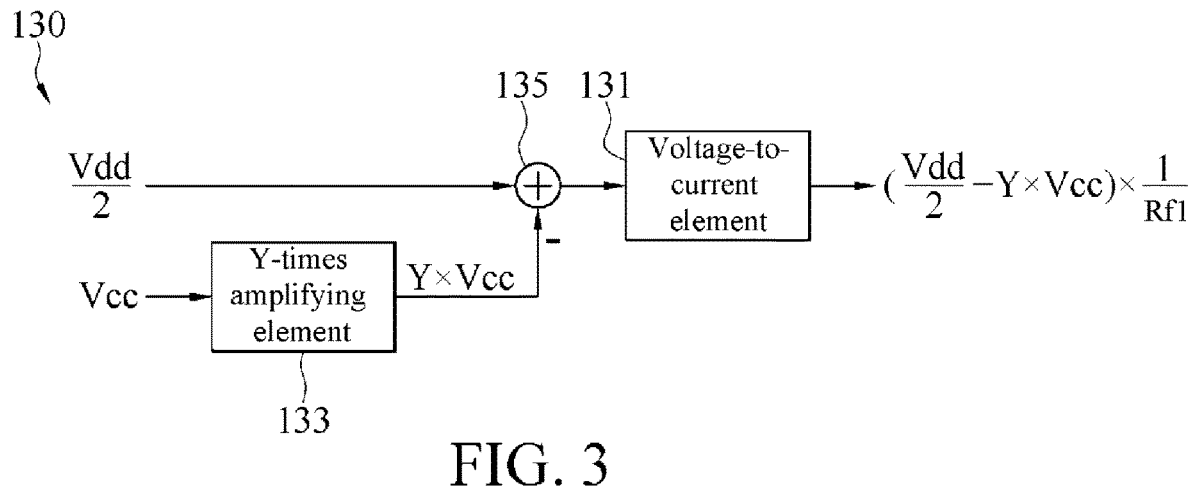
FIG. 3 is a schematic operation diagram of an example of a voltage-adjusting circuit shown in FIG. 1.

In an example, referring to FIG. 3, the voltage-adjusting circuit 130 may include a voltage-to-current element 131, a Y-times amplifying element 133, and a subtractor 135. The Y-times amplifying element 133 receives the first power voltage Vcc. A first input terminal of the subtractor 135 receives a half of the second power voltage Vdd. A second input terminal of the subtractor 135 is coupled to an output of the Y-times amplifying element 133, that is, receives Y times the first power voltage Vcc (for example, $$It = \left(\frac{Vdd}{2} - Y \times Vcc\right) \times \frac{1}{Rf1}).$$

An output terminal of the subtractor 135 is coupled to the voltage-to-current element 131. The voltage-to-current element 131 generates an adjusting current (It) according to the second power voltage Vdd and Y times the second power voltage Vdd (for example, $$It = \left(\frac{Vdd}{2} - Y \times Vcc\right) \times \frac{1}{Rf1}).$$

Y is a specific multiplier and Y is a constant. In some embodiments, the voltage-to-current element 131 may be, for example, an impedance element (for example, $$\frac{1}{Rf1}),$$

but is not limited thereto.

Herein, a relation of the input operating voltage (Vz) is as Formula 1.

$$Vz = \frac{Vdd}{2} - It \times Rf1 \qquad \text{Formula 1}$$

A relation of the adjusting current (It) obtained according to a circuit design of the voltage-adjusting circuit 130 is as Formula 2.

$$It = \left(\frac{Vdd}{2} - Vy\right) \times \frac{1}{Rf1} \qquad \text{Formula 2}$$

$$\frac{1}{Rf1}$$

indicates the voltage-to-current element 131, and Vy indicates a first amplified voltage generated by the Y-times amplifying element 133. Herein, the first amplified voltage Vy and the first power voltage Vcc may be in a proportional relationship. Moreover, the proportional relationship may be a specific multiplier, that is, the foregoing Y times. In other words, the first amplified voltage Vy may be implemented as Y times the first power voltage Vcc. In this case, the adjusting current (It) of Formula 2 can be replaced with Formula 3.

$$It = \left(\frac{Vdd}{2} - Y \times Vcc\right) \times \frac{1}{Rf1} \qquad \text{Formula 3}$$

It can be learned from Formula 3 that, the adjusting current (It) and a difference between the second power voltage Vdd and a specific multiple of the first power voltage Vcc (e.g. Y times the first power voltage Vcc) are in a proportional relationship. Then, the adjusting current (It) of Formula 3 is substituted into Formula 1, to obtain a relation of the input operating voltage (Vz) as Formula 4.

$$Vz = \frac{Vdd}{2} - \left(\frac{Vdd}{2} - Y \times Vcc\right) \times \frac{1}{Rf1} \times Rf1 = Y \times Vcc \qquad \text{Formula 4}$$

In Formula 4, $$Vz \neq \frac{Vcc}{2}.$$

It can be learned that, in the circuit design of the voltage-adjusting circuit 130, the input operating voltage (Vz) and the first power voltage Vcc may be in a proportional relationship (Y times). Therefore, the input operating voltage (Vz) is not affected by change of the second power voltage Vdd.

Figure 4:
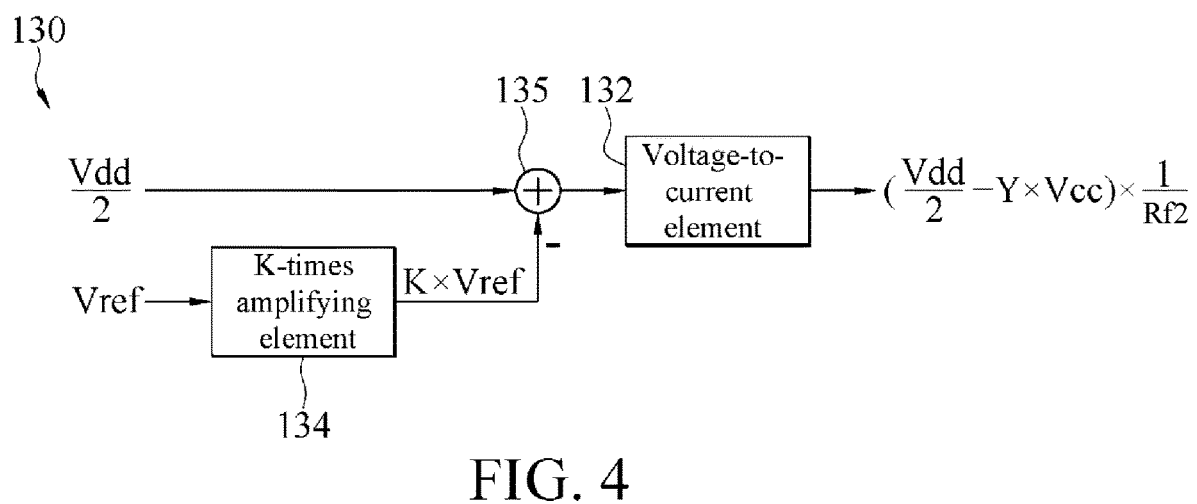
FIG. 4 is a schematic operation diagram of an example of a voltage-adjusting circuit shown in FIG. 1.

In another example, referring to FIG. 4, the voltage-adjusting circuit 130 may include a voltage-to-current element 132, a K-times amplifying element 134, and a subtractor 135. The K-times amplifying element 134 receives a reference voltage Vref. A first input terminal of the subtractor 135 receives a half of the second power voltage Vdd. A second input terminal of the subtractor 135 is coupled to an output of the K-times amplifying element 134, that is, receives K times the reference voltage Vref (for example, $$It = \left(\frac{Vdd}{2} - K \times Vref\right) \times \frac{1}{Rf2}).$$

An output terminal of the subtractor 135 is coupled to the voltage-to-current element 132. The voltage-to-current element 132 generates an adjusting current (It) according to the second power voltage Vdd and K times the reference voltage Vref (for example, $$It = \left(\frac{Vdd}{2} - K \times Vref\right) \times \frac{1}{Rf2}).$$

K is a specific multiplier and K is a constant. Herein, K and Y may be a same value or different values. In some embodiments, the voltage-to-current element 132 may be, for example, an impedance element (for example, $$\frac{1}{Rf2}),$$

but is not limited thereto.

Herein, a relation of the input operating voltage (Vz) is as Formula 5.

$$Vz = \frac{Vdd}{2} - It \times Rf2 \qquad \text{Formula 5}$$

A relation of the adjusting current (It) obtained according to a circuit design of the voltage-adjusting circuit 130 is as Formula 6.

$$It = \left(\frac{Vdd}{2} - Vk\right) \times \frac{1}{Rf2} \qquad \text{Formula 6}$$

$$\frac{1}{Rf2}$$

indicates the voltage-to-current element 132, and Vk indicates a second amplified voltage generated by the K-times amplifying element 134. Herein, the second amplified voltage Vk and the reference voltage Vref are in a proportional relationship. Moreover, the proportional relationship may be a specific multiplier, that is, the foregoing K times. In other words, the second amplified voltage Vk may be implemented as K times the reference voltage Vref. Therefore, the adjusting current (It) of Formula 6 can be replaced with Formula 7.

$$It = \left(\frac{Vdd}{2} - K \times Vref\right) \times \frac{1}{Rf2} \qquad \text{Formula 7}$$

It can be learned from Formula 7 that, the adjusting current (It) and a difference between the second power voltage Vdd and a specific multiple of the reference voltage Vref (e.g. K times the reference voltage Vref) are in a proportional relationship. Then, the adjusting current (It) of Formula 7 is substituted into Formula 5, to obtain a relation of the input operating voltage (Vz) as Formula 8.

$$Vz = \frac{Vdd}{2} - \left(\frac{Vdd}{2} - K \times Vref\right) \times \frac{1}{Rf2} \times Rf2 = K \times Vref \qquad \text{Formula 8}$$

In Formula 8, $$Vz \neq \frac{Vcc}{2}.$$

It can be learned that, in the circuit design of the voltage-adjusting circuit 130, the input operating voltage (Vz) and the reference voltage Vref may be in a proportional relationship (K times). Therefore, the input operating voltage (Vz) is not affected by change of the second power voltage Vdd. In some embodiments, the reference voltage Vref may be generated through any reference voltage generating circuit. For example, the reference voltage may be a fixed (constant) voltage or a bandgap voltage.

In some embodiments, the feedback path can be implemented by using a feedback resistor Rf. Herein, the output terminal of the drive circuit 190 is coupled to the input terminal of the operational amplifier 150 through a feedback resistor Rf. For example, the driving signal Vo output by the drive circuit 190 is converted into a corresponding feedback signal If through the feedback resistor Rf. Then, the formed feedback signal If is sent back and input to the input terminal of the operational amplifier 150.

To sum up, according to the D-class amplifier circuit and the audio amplifying method in the disclosure, the input operating voltage of the operational amplifier is not affected by a supply voltage (the second power voltage) at an output stage, and the input operating voltage is not required to be fixed to be a half of a supply voltage (the first power voltage) of the operational amplifier, so that the input operating voltage can be determined according to various input pair forms of the operational amplifier, thereby reaching an optimal operating voltage range of the operational amplifier.

What is claimed is:

1. A circuit, comprising:
    an operational amplifier coupled to a first power voltage and configured to output an amplified signal according to an input operating voltage and a feedback signal;
    an input impedance coupled to an input terminal of the operational amplifier and configured to receive an input voltage and to output an input current;
    a voltage-adjusting circuit configured to adjust the input operating voltage of the operational amplifier;
    a pulse-generating circuit configured to generate a pulse width modulation signal according to the amplified signal; and
    a drive circuit coupled to a second power voltage and configured to generate a driving signal according to the pulse width modulation signal, the feedback signal being correlated with the driving signal;

wherein the voltage-adjusting circuit supplies an adjusting current to adjust the input operating voltage, and the adjusting current and a difference between the second power voltage and a specific multiple of the first power voltage are in a proportional relationship.

2. A circuit, comprising:

an operational amplifier coupled to a first power voltage and configured to output an amplified signal according to an input operating voltage and a feedback signal;

an input impedance coupled to an input terminal of the operational amplifier and configured to receive an input voltage and to output an input current;

a voltage-adjusting circuit configured to adjust the input operating voltage of the operational amplifier;

a pulse-generating circuit configured to generate a pulse width modulation signal according to the amplified signal; and a drive circuit coupled to a second power voltage and configured to generate a driving signal according to the pulse width modulation signal, the feedback signal being correlated with the driving signal;

wherein the voltage-adjusting circuit supplies an adjusting current to adjust the input operating voltage, the adjusting current is uncorrelated with the first power voltage, and the adjusting current and a difference between the second power voltage and a specific multiple of a reference voltage are in a proportional relationship.

3. The circuit according to claim 1, wherein a maximum current value of the second power voltage is greater than or equal to ten times a maximum current value of the first power voltage.

4. A method, comprising:

adjusting an input operating voltage of an operational amplifier powered by a first power voltage;

outputting, by the operational amplifier, an amplified signal according to the input operating voltage and a feedback signal;

outputting a pulse width modulation signal according to the amplified signal; and generating a driving signal according to the pulse width modulation signal, the driving signal being correlated with the feedback signal;

wherein the step of adjusting the input operating voltage of the operational amplifier comprises supplying an adjusting current to adjust the input operating voltage, and wherein the adjusting current and a difference between a second power voltage and a specific multiple of the first power voltage are in a proportional relationship.

5. The method according to claim 4, wherein a maximum current value of a second power voltage is greater than or equal to ten times a maximum current value of the first power voltage.

6. The circuit according to claim 2, wherein a maximum current value of the second power voltage is greater than or equal to ten times a maximum current value of the first power voltage.

* * * * *